United States Patent
Xu et al.

(10) Patent No.: US 11,282,695 B2
(45) Date of Patent: Mar. 22, 2022

(54) SYSTEMS AND METHODS FOR WAFER MAP ANALYSIS

(71) Applicant: Samsung Electronics Co., Ltd., Suwon-si (KR)

(72) Inventors: Nuo Xu, Milpitas, CA (US); Fan Chen, Milpitas, CA (US); Weiyi Qi, San Jose, CA (US); Jongchol Kim, Seong-Nam Si (KR); Jing Wang, San Jose, CA (US); Yang Lu, San Jose, CA (US); Woosung Choi, Milpitas, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 343 days.

(21) Appl. No.: 16/107,942

(22) Filed: Aug. 21, 2018

(65) Prior Publication Data

US 2019/0096659 A1     Mar. 28, 2019

Related U.S. Application Data

(60) Provisional application No. 62/563,625, filed on Sep. 26, 2017.

(51) Int. Cl.
*H01L 21/02* (2006.01)
*G06N 3/08* (2006.01)
(Continued)

(52) U.S. Cl.
CPC .... *H01L 21/02008* (2013.01); *G06F 9/30003* (2013.01); *G06N 3/0454* (2013.01);
(Continued)

(58) Field of Classification Search
CPC . H01L 21/02008; G06N 3/08; G06F 9/30003; H02J 50/27; H02J 50/80;
(Continued)

(56) References Cited

U.S. PATENT DOCUMENTS 9,546,862 B2   1/2017   Chen et al.
9,779,202 B2   10/2017  Vukkadala et al.
(Continued)

FOREIGN PATENT DOCUMENTS

CN    102393248 A    3/2012
CN    104155302 A    11/2014
(Continued)

OTHER PUBLICATIONS

Pan, Yang, "Ring Oscillator Frequency Measurements Using an Automated Parametric Test System", White Paper, Keithly Instruments, Inc., 2008, pp. 1-12.
(Continued)

*Primary Examiner* — Edward Chin
(74) *Attorney, Agent, or Firm* — Lewis Roca Rothgerber Christie LLP

(57) ABSTRACT

A system for reconstructing wafer maps of semiconductor wafers includes: a processor; and memory having instructions stored thereon that, when executed by the processor, cause the processor to: receive test data of a wafer at sparse sampling locations of the wafer, the sparse sampling locations being selected based on a probing mask; and compute a reconstructed wafer map by performing compressed sensing with Zernike polynomials on the test data at sparse locations of the wafer.

10 Claims, 15 Drawing Sheets

(51) Int. Cl.
*G06F 9/30* (2018.01)
*G06N 3/04* (2006.01)
*G06N 3/12* (2006.01)

(52) U.S. Cl.
CPC ............... *G06N 3/08* (2013.01); *G06N 3/084* (2013.01); *G06N 3/126* (2013.01)

(58) Field of Classification Search
CPC ......... H02J 50/001; H01Q 1/248; H03H 7/38; H03H 2007/386
See application file for complete search history.

(56) References Cited

U.S. PATENT DOCUMENTS

| | | | |
|---|---|---|---|
| 9,865,047 | B1 | 1/2018 | Chen et al. |
| 10,311,187 | B2 | 6/2019 | Jeon et al. |
| 2003/0103189 | A1* | 6/2003 | Neureuther ........ G01M 11/0264 351/159.74 |
| 2006/0274933 | A1 | 12/2006 | Obara et al. |
| 2007/0254386 | A1 | 11/2007 | Asano |
| 2007/0288185 | A1* | 12/2007 | Burch ................. G05B 23/024 702/81 |
| 2008/0155446 | A1 | 6/2008 | Pannese et al. |
| 2008/0155450 | A1 | 6/2008 | Pannese et al. |
| 2013/0045545 | A1 | 2/2013 | Lee et al. |
| 2015/0227654 | A1 | 8/2015 | Hunsche et al. |
| 2017/0038201 | A1 | 2/2017 | Bozdog et al. |
| 2017/0046473 | A1 | 2/2017 | Fouquet et al. |
| 2017/0242425 | A1* | 8/2017 | Buhl .................. G05B 19/4188 |
| 2017/0351952 | A1* | 12/2017 | Zhang .................. G06N 3/0454 |
| 2018/0365369 | A1* | 12/2018 | Fouquet .................. G06F 30/20 |

FOREIGN PATENT DOCUMENTS

| | | |
|---|---|---|
| CN | 105004729 A | 10/2015 |
| CN | 106295521 A | 1/2017 |
| CN | 106485324 A | 3/2017 |
| CN | 106570212 A | 4/2017 |
| JP | 6-160297 A | 6/1994 |
| JP | 2007-287742 A | 11/2007 |
| KR | 10-2017-0015500 A | 2/2017 |

OTHER PUBLICATIONS

Sonderman, Tom, et al., "Advanced Process Control in Semiconductor Manufacturing", Jan. 5, 2009, pp. 1-71.
Devarakond, Shyam Kumar, "Signature Driven Low Cost Test, Diagnosis and Tuning of Wireless Systems", A Dissertation Presented to the Academic Faculty, Georgia Institute of Technology, May 2013, pp. 1-222.
Chinese Office Action dated Sep. 28, 2021, issued in corresponding Chinese Patent Application No. 201811101527.8 (7 pages).
Chinese Office Action dated Dec. 21, 2020, issued in corresponding Chinese Patent Application No. 201811101527.8 (6 pages).

* cited by examiner

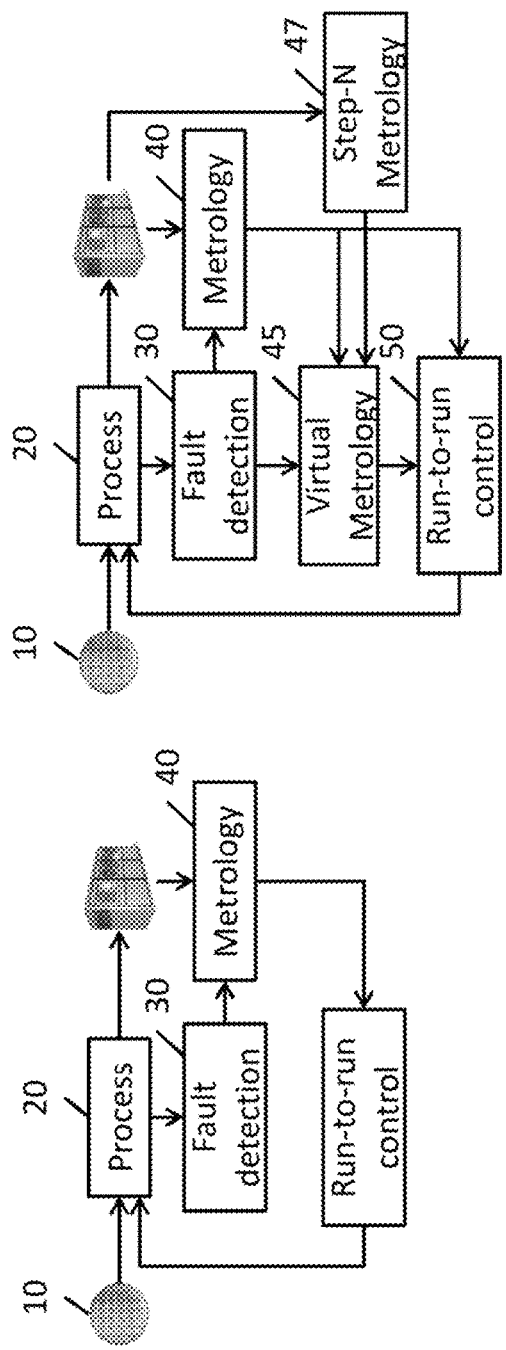
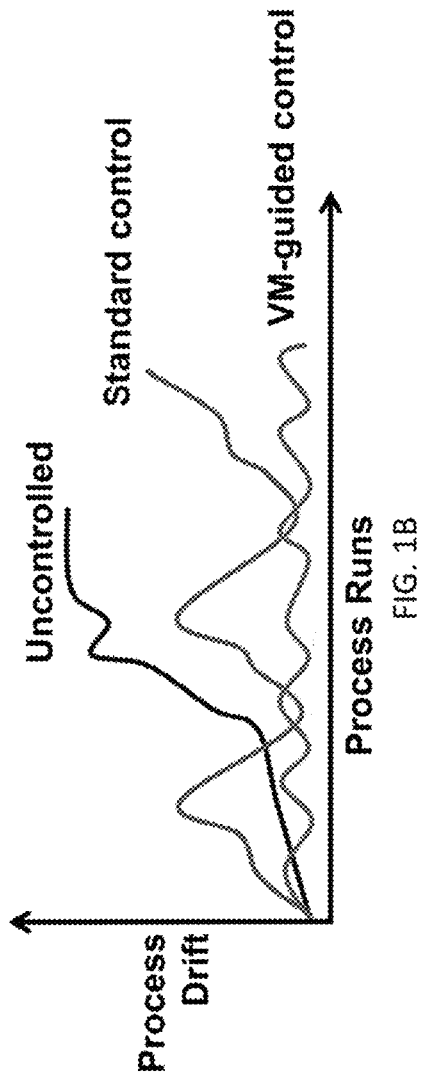
FIG. 1A
FIG. 1C
FIG. 1B

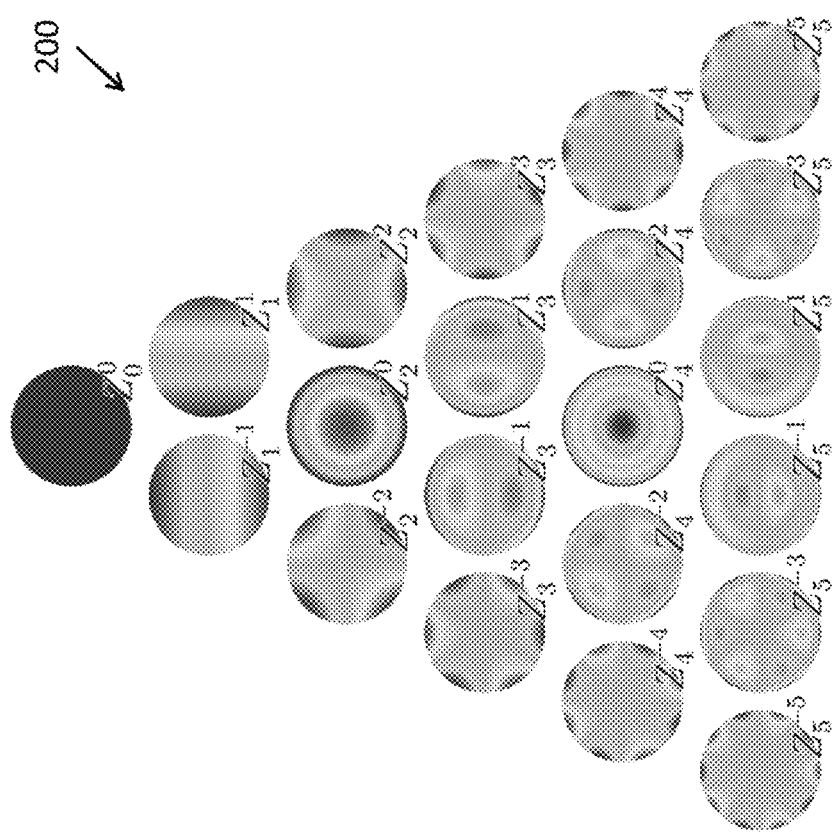

FIG. 5D-1
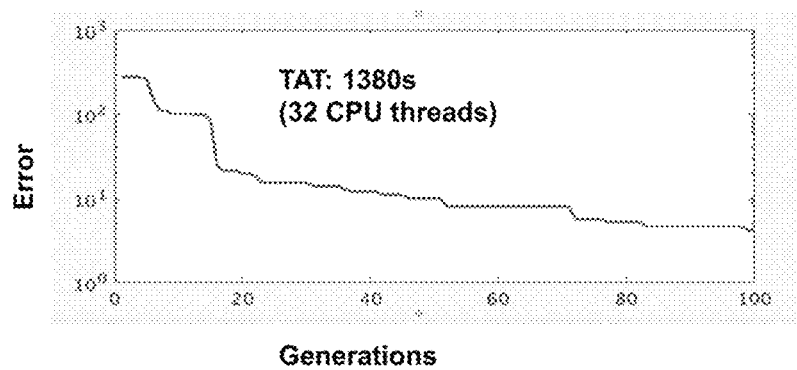
FIG. 5D-2
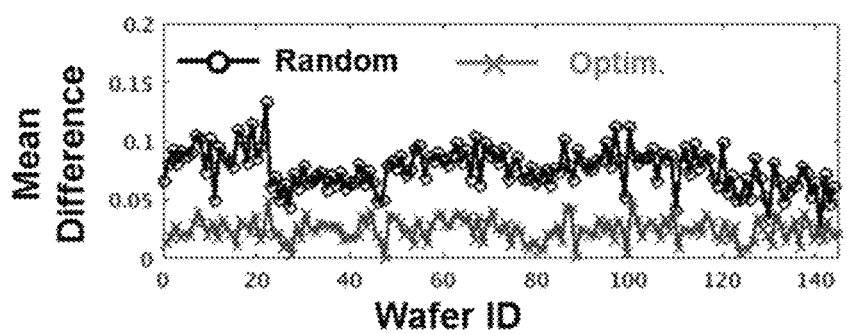
FIG. 5D-3
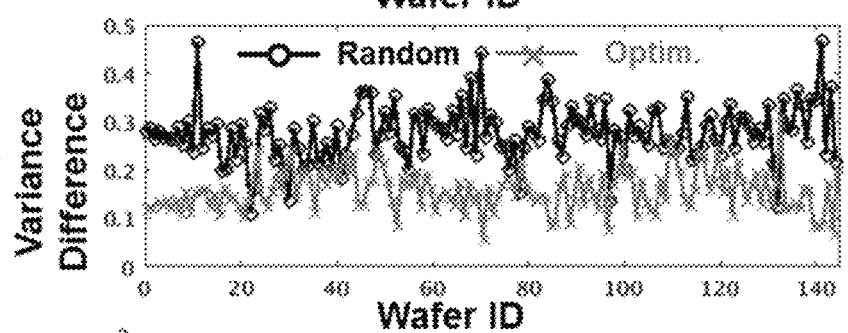
FIG. 5D-4
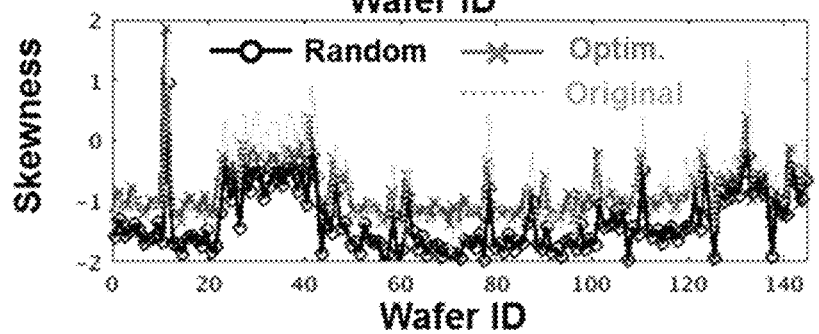
FIG. 5D

SYSTEMS AND METHODS FOR WAFER MAP ANALYSIS

CROSS-REFERENCE TO RELATED APPLICATION(S)

This application claims priority to and the benefit of U.S. Provisional Patent Application No. 62/563,625, filed in the United States Patent and Trademark Office on Sep. 26, 2017, the entire disclosure of which is incorporated by reference herein.

FIELD

Aspects of embodiments of the present invention relate to defect detection and analysis in the field of semiconductor device fabrication.

BACKGROUND

In the field of semiconductor device fabrication and semiconductor manufacturing operations, many individual integrated circuits (ICs) are formed on a wafer substrate (typically mono-crystalline silicon). During various steps of the semiconductor fabrication process, various process steps including deposition, removal, patterning, and modification of electrical properties (e.g., doping) are applied to the wafer in order to generate the ICs. Each IC is formed in a particular section of the wafer, and a block of semiconducting material corresponding to one IC is commonly referred to as a die. Many wafers may undergo the fabrication process simultaneously and/or concurrently (e.g., in parallel or in a pipelined process).

The integrated circuits of the dies on a wafer are typically subjected to testing after the completion of the fabrication process. A wafer prober may be used test the functionality and performance of each die on the wafer, such as by supplying known input waveforms (test patterns) to the dies and measuring the output waveforms generated by the ICs of the dies. The dies are then classified (or "binned") based on the measured performance. Examples of classifications include "good," "open circuit," "short circuit" or finer grained classifications such as impedance, clock speed, or partial failures of particular portions of the die (e.g., one or more non-functional cores of a multi-core processor or failed portions of cache memory). The resulting classifications are commonly represented on a color-coded or shaded grid, where each location on the grid corresponds to a different die, and the color (or shade) identifies how the die at the location has been classified (or binned). After the wafer is tested, the wafer is scored and then broken into the individual dies (referred to as wafer dicing), and the dies containing integrated circuits that are known to be good are packaged (e.g., encapsulated into a supporting plastic or ceramic case). The yield of a semiconductor manufacturing process may refer to the percentage of dies that have good (functioning) integrated circuits.

SUMMARY

Aspects of embodiments of the present invention relate to systems and methods for generating full wafer maps showing predicted classifications of dies of a wafer without testing all of the dies on the wafer.

According to one embodiment of the present invention, a system for reconstructing wafer maps of semiconductor wafers includes: a processor; and memory having instructions stored thereon that, when executed by the processor, cause the processor to: receive test data of a wafer at sparse sampling locations of the wafer, the sparse sampling locations being selected based on a probing mask; and compute a reconstructed wafer map by performing compressed sensing with Zernike polynomials on the test data at sparse locations of the wafer.

The sparse sampling locations of the probing mask may be randomly selected.

The sparse sampling locations of the probing mask may be generated by: receiving a training set of ground truth wafer maps; setting a probing mask based on an initial set of sparse sampling locations; selecting samples from the training set of ground truth wafer maps based on the probing mask; applying a genetic algorithm to compute a customized probing mask, the genetic algorithm iteratively, over a plurality of generations: computing reconstructed wafer maps using compressed sensing based on the test data taken from the sparse sampling locations; scoring the reconstructed wafer maps against the training set of ground truth wafer maps; updating the sparse sampling locations of the probing mask in accordance with the scores; and returning the updated sparse sampling locations of the probing mask from the genetic algorithm when a threshold error rate is satisfied or when the plurality of generations reaches a generation limit.

The memory may further store instructions that, when executed by the processor, cause the processor to supply the reconstructed wafer map reconstructed by compressed sensing to a first convolutional neural network, the first convolutional neural network being configured to update the reconstructed wafer map.

The first convolutional neural network may be trained by: receiving a training set of ground truth wafer maps; selecting samples from the training set of ground truth wafer maps based on the probing mask; computing training reconstructed wafer maps from the selected samples from the training set of ground truth wafer maps; and applying backpropagation to train the first convolutional neural network to compute the training set of ground truth wafer maps from the training reconstructed wafer maps.

The memory may further store instructions that, when executed by the processor, cause the processor to classify the reconstructed wafer map with one of a plurality of labels using a classifier, and the classifier may be trained using: a training set of ground truth wafer maps; and a plurality of labels of the training set of ground truth wafer maps, the plurality of labels being computed by applying an anomaly detection technique to the training set of ground truth wafer maps to identify one or more classes of wafers, the classes of wafers including anomalous wafers and non-anomalous wafers.

The anomaly detection technique may include at least one of principal component analysis or biclustering.

The memory may further store instructions that, when executed by the processor, cause the processor to supply a plurality of Zernike polynomial coefficients corresponding to the reconstructed wafer map to the classifier, and wherein the classifier may be trained by: selecting samples from the training set of ground truth wafer maps based on the probing mask; computing training reconstructed wafer maps from the selected samples from the training set of ground truth wafer maps; and training the classifier to predict the plurality of labels based on a plurality of training Zernike polynomial coefficients from the training reconstructed wafer maps.

The memory may further store instructions that, when executed by the processor, cause the processor to: supply the reconstructed wafer map to a feature extractor to compute a feature map; and supply the feature map to a second trained classifier to classify the reconstructed wafer map with one of the plurality of labels, wherein the feature extractor may be a second convolutional neural network, the second convolutional neural network being trained by training the classifier to predict the plurality of labels based on the training set of ground truth wafer maps.

The may be configured to provide feedback to a run-to-run controller of a semiconductor fabrication process based on the reconstructed wafer map.

According to one embodiment of the present invention, a method for reconstructing wafer maps of semiconductor wafers includes: receiving, by a processor, test data of a wafer at sparse sampling locations of the wafer, the sparse sampling locations being selected based on a probing mask; and computing, by the processor, a reconstructed wafer map by performing compressed sensing with Zernike polynomials on the test data at sparse locations of the wafer.

The sparse sampling locations of the probing mask may be randomly selected.

The sparse sampling locations of the probing mask may be generated by: receiving a training set of ground truth wafer maps; setting a probing mask based on an initial set of sparse sampling locations; selecting samples from the training set of ground truth wafer maps based on the probing mask; applying a genetic algorithm to compute a customized probing mask, the genetic algorithm iteratively, over a plurality of generations: computing reconstructed wafer maps using compressed sensing based on the test data taken from the sparse sampling locations; scoring the reconstructed wafer maps against the training set of ground truth wafer maps; updating the sparse sampling locations of the probing mask in accordance with the scores; and returning the updated sparse sampling locations of the probing mask from the genetic algorithm when a threshold error rate is satisfied or when the plurality of generations reaches a generation limit.

The method may further include supplying the reconstructed wafer map reconstructed by compressed sensing to a first convolutional neural network, the first convolutional neural network being configured to update the reconstructed wafer map.

The first convolutional neural network may be trained by: receiving a training set of ground truth wafer maps; selecting samples from the training set of ground truth wafer maps based on the probing mask; computing training reconstructed wafer maps from the selected samples from the training set of ground truth wafer maps; and applying backpropagation to train the first convolutional neural network to compute the training set of ground truth wafer maps from the training reconstructed wafer maps.

The method may further include classifying the reconstructed wafer map with one of a plurality of labels using a classifier, wherein the classifier may be trained using: a training set of ground truth wafer maps; and a plurality of labels of the training set of ground truth wafer maps, the plurality of labels being computed by applying an anomaly detection technique to the training set of ground truth wafer maps to identify one or more classes of wafers, the classes of wafers including anomalous wafers and non-anomalous wafers.

The anomaly detection technique may include at least one of principal component analysis or biclustering.

The method may further include supplying a plurality of Zernike polynomial coefficients corresponding to the reconstructed wafer map to the classifier, wherein the classifier may be trained by: selecting samples from the training set of ground truth wafer maps based on the probing mask; computing training reconstructed wafer maps from the selected samples from the training set of ground truth wafer maps; and training the classifier to predict the plurality of labels based on a plurality of training Zernike polynomial coefficients from the training reconstructed wafer maps.

The method may further include: supplying the reconstructed wafer map to a feature extractor to compute a feature map; and supplying the feature map to a second trained classifier to classify the reconstructed wafer map with one of the plurality of labels, wherein the feature extractor may be a second convolutional neural network, the second convolutional neural network being trained by training the classifier to predict the plurality of labels based on the training set of ground truth wafer maps.

The method may further include controlling a run-to-run controller of a semiconductor fabrication process based on the reconstructed wafer map.

BRIEF DESCRIPTION OF THE DRAWINGS

The accompanying drawings, together with the specification, illustrate exemplary embodiments of the present invention, and, together with the description, serve to explain the principles of the present invention.

FIG. 1A is a schematic block diagram illustrating a comparative semiconductor process control flow.

FIG. 1B is a graph qualitatively depicting a magnitude of process drift of a semiconductor manufacturing process over the course of additional process runs under various process control schemes.

FIG. 1C is a schematic block diagram illustrating a semiconductor process control flow using virtual metrology according to some embodiments of the present invention.

FIG. 2 depicts the first 21 Zernike polynomials, ordered vertically by radial degree and horizontally by azimuthal degree.

FIG. 5D includes graphs comparing ground truth wafer maps with wafer reconstructions based on a random sampling of the wafers and wafer reconstructions based on sampling of the wafers guided by a customized or optimized probing mask according to one embodiment of the present invention.

DETAILED DESCRIPTION

Figure 3:
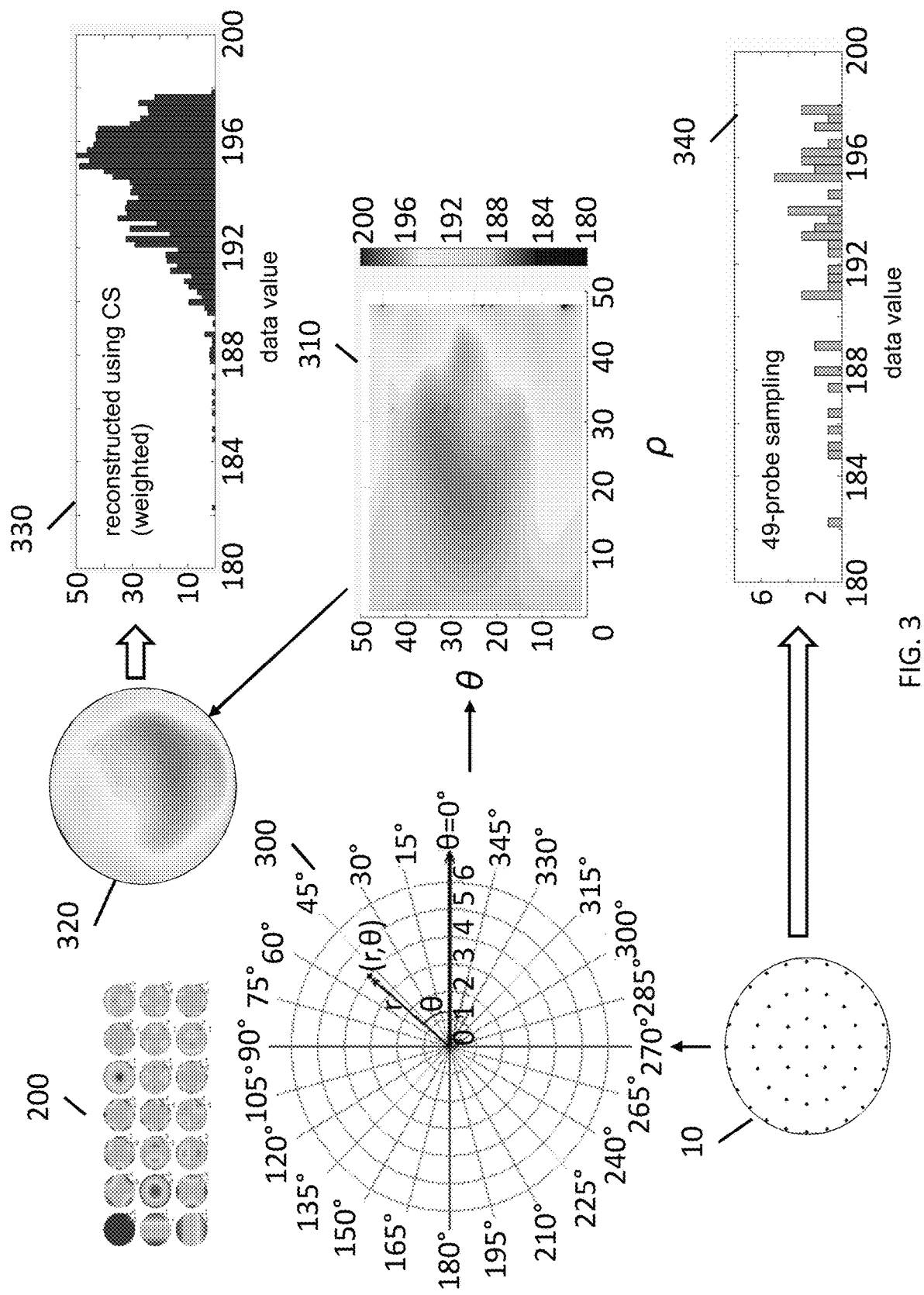
FIG. 3 is a schematic diagram illustrating the reconstruction, according to one embodiment of the present invention, of a wafer map from a set of 49 samples of a wafer.

In the following detailed description, only certain exemplary embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

Aspects of embodiments of the present invention relate to generating full wafer maps of predicted classifications of all of the dies on the wafer by sampling only a subset of the dies of the wafer. By sampling only a subset of the dies, the time spent testing the individual dies of the wafer is reduced, thereby shortening turn-around times (TAT) for generating the wafer maps, allowing for earlier detection of problems in the semiconductor fabrication process and adjustment of the semiconductor manufacturing equipment to resolve those problems. This, in turn, reduces the fraction of non-functional integrated circuits in the wafers produced by the semiconductor fabrication process and increases yields, thereby reducing waste and increasing efficiency.

FIG. 1A illustrates a comparative system in which a semiconductor wafer 10 undergoes a semiconductor manufacturing process 20, during which faults may be detected by a fault detection and classification system 30, and where wafers may undergo measurement and analysis (metrology) 40 to determine various characteristics of the wafer. The resulting measurements may be used to reconfigure the process (run-to-run control 50) to adjust for process drift (e.g., variations in the attributes of the manufactured semiconductor devices over time, e.g., from wafer to wafer).

FIG. 1B is a graph qualitatively depicting a magnitude of process drift of a semiconductor manufacturing process over the course of additional process runs under various process control schemes. FIG. 1B shows that, under uncontrolled circumstances, process may drift farther from the designed state as the number of process runs increases, thereby also reducing yields because the process drift can cause the integrated circuits on the dies to be fabricated incorrectly. On the other hand, under standard run-to-run controls, as shown in FIG. 1A, the process may be periodically adjusted to return the process to its designed state.

FIG. 1C illustrates a semiconductor manufacturing system in which virtual metrology is also used to provide tighter run-to-run control. Virtual metrology refers to the prediction of metrology variables (either measureable or non-measurable) using process data (from the fault detection and classification system) or partial metrology data (e.g., from various steps of the process, such as "Step-N" of the process). Because virtual metrology is capable of shorter turn-around-times, than conventional metrology techniques, feedback can be provided to the run-to-run control system more frequently, thereby reducing the amount of process variation, as shown by the line labeled "VM-guided control" in FIG. 1B.

Accordingly, aspects of embodiments of the present invention relate to systems and methods for generating virtual metrology data. Aspects of embodiments of the present invention include: generating a full reconstructed wafer map of characteristics of all of the dies of a wafer using only sparse samples collected from selected dies of the wafer (e.g., collected by using the wafer prober to test a sparse sampling of the dies of the wafer); computing a set of sampling points (a probe mask) to be used for all wafers of a wafer set (e.g., a set of wafers that are expected to exhibit correlated characteristics); and identifying hidden variables among the multiple process steps to enable earlier and more reliable detection of process drift or other problems. The generation of the full wafer map from the sparse samples may be referred to herein as a "reconstruction" of the wafer map, and the identification and computation of the hidden variables may be referred to as "indexing" a wafer and computing a "feature map" for the wafer. Implementing techniques according to embodiments of the present invention improves the quality of control over the semiconductor manufacturing process, thereby improving yields.

Compressed sensing is a signal processing technique for efficient reconstruction of a signal by finding solutions to underdetermined linear systems. In some circumstances, compressed sensing allows for accurate reconstruction of signals from samples obtained below (or less than) the Nyquist rate. The general procedure for compressed sensing involves identifying a transform domain in which the signal is sparse and solving the sparse regression problem with the $L_0$ or $L_1$ norm as a regularized term. Specific examples of compressed sensing techniques include the "basis pursuit" approach using a Primal-Dual interior point method, a "matching pursuit" (see, e.g., J. Tropp and A. C. Gilbert, "Signal recovery from partial information via orthogonal matching pursuit,"IEEE Trans. Inform. Theory, vol. 53, no. 12, pp. 4655-4666, 2007.), and convex optimization, also known as LASSO (see, e.g., R. Tibshirani, "Regression shrinkage and selection via the lasso," J. Roy. Stat. Soc. Ser. B, vol. 58, no. 1, pp. 267-288, 1996.). Also, see, generally, J. Romberg, "Compressed Sensing: A Tutorial," IEEE Statistical Signal Processing Workshop, (2007) and Candès, Emmanuel J., and Michael B. Wakin. "An introduction to compressive sampling." *IEEE signal processing magazine* 25.2 (2008):21-30.

Variability within semiconductor wafers generally takes on a radial shape. This may be due to the practice of rotating of the wafer during processing to increase process uniformity. In chemical vapor deposition (CVD), species depletion, temperature non-uniformity are affected by wafer boundary conditions (see, e.g., J. Sali, "Hot-wire CVD growth simulation for thickness uniformity," Proc. Int. Conf. Cat-CVD Process, 2001.) In physical vapor deposition (PVD) and etching steps, re-deposition effects and the distribution of the radio frequency electric field can also cause radially-shaped variability (see, e.g., T. W. Kim, "Investigation of etch rate uniformity of 60 MHz plasma etching equipment," JJAP, 2001 & J. Electrochem. 2003.) Furthermore, the temperature of the wafer is generally higher at its center (see, e.g., Q. Zhang, "One step forward from run-to-run critical dimension control: Across-wafer level critical dimension control through lithography and etch process," J. Process Control, 2008.). Other sources of variability having radially shaped characteristics include photoresist coating and wafer deformation. (Other, non-radially shaped variability can also arise from factors such as random dopant fluctuations, line-edge roughness, and the like.)

Zernike polynomials provide a basis for a spatially varied function over a circular region using a set of radial basis. FIG. 2 depicts the first 21 Zernike polynomials, ordered vertically by radial degree and horizontally by azimuthal degree. The even modes of the Zernike polynomials are given by:

$$Z_n^m(\rho, \varphi) = R_n^m(\rho)\cos(m\varphi)$$

The odd modes are given by:

$$Z_n^{-m}(\rho, \varphi) = R_n^m(\rho)\sin(m\varphi)$$

where, when n−m is even:

$$R_n^m(\rho) = \sum_{k=0}^{\frac{n-m}{2}} \frac{(-1)^k (n-k)!}{k!\left(\frac{n+m}{2}-k\right)!\left(\frac{n-m}{2}-k\right)!} \rho^{n-2k}$$

and, zero (0) when n−m is odd.

Therefore, Zernike polynomials are a suitable basis for use in compressed sensing in the context of wafer maps for semiconductor wafers and are a more suitable basis than other potential bases such as the discrete cosine transform. Given that the samples taken from the wafers will generally exhibit large noise components and some irregular patterns, regularizations and validations (e.g., cross-validation and grid search for hyper-parameters) may be applied to find the correct solution:

$$\begin{pmatrix} Z_0^0(x_0, y_0) & \cdots & Z_n^m(x_0, y_0) \\ \vdots & \ddots & \vdots \\ Z_0^0(x_k, y_k) & \cdots & Z_n^m(x_k, y_k) \end{pmatrix} \begin{pmatrix} G_{00} \\ \vdots \\ G_{nm} \end{pmatrix} = \begin{pmatrix} B(x_0, y_0) \\ \vdots \\ B(x_k, y_k) \end{pmatrix} \to \min_G \|ZG - B\|_{L2}^2$$

where G refers to the transferred domain (Zernike domain) coefficients to be solved for and B refers to the observations (samples), and where k<<nm (indicating that this is an underdetermined problem).

To solve the underdetermined system for compressed sensing, underdetermined linear programming techniques using regularization may be applied, such as LASSO:

$$\min \lambda\|G\|_{L1} + \|ZG-B\|_{L2}^2$$

and such as Matching Pursuit:

$$\min \lambda\|G\|_{L0} + \|ZG-B\|_{L2}^2$$

where λ is a regularization term.

Separately, deep neural networks (DNNs) are widely used in image classification (e.g., identifying whether an image is of a hot dog or not). In addition, convolutional neural networks (CNNs) can be used to classify different portions of an image (e.g., which portions of an image of a street correspond to the pavement, sidewalks, trees, vehicles, and pedestrians). Deep convolutional neural networks (DCNNs) may also be used a feature extractors for images (e.g., taking the output of the layer of the neural network before the final classification layer or layers (or "classifier") as a set of "features").

Accordingly, aspects of embodiments of the present invention relate to taking sparse samples of selected locations of a wafer and combining a compressed sensing methodology (e.g., using Zernike polynomials) and deep convolutional neural networks (DCNNs) to reconstruct the missing spatial information (e.g., the full wafer map) from the sparse samples and to extract a "footprint" or "signature" of a wafer map from the reconstructed spatial information.

FIG. 3 is a schematic diagram illustrating the reconstruction, according to one embodiment of the present invention, of a wafer map from a set of samples of a wafer. As shown in FIG. 3, a wafer 10 is sampled at 49 locations to generate a mesh 300. A Zernike polynomial basis 200 is used to reconstruct a wafer map in polar coordinates 310, which can be transformed to a wafer map in Cartesian coordinates 320. The resulting wafer map can then be analyzed, as shown by the histogram 330. For comparison, the direct values of sampled by the 49 probes is also shown in a histogram 340. As seen in FIG. 3, the histogram 330 from the wafer map reconstructed through compressed sensing provides a more accurate representation of the actual distribution of values on the wafer than the histogram 340 of the sparse samples alone.

Table 1 shows the re-extracted statistical values for various mesh sizes of samples. As the mesh size increases, the variance and the skewness decrease, showing the improvement in the validity of the sample's distribution and statistical analytics. Accordingly, increased density of the sampling mesh (or decreased sparsity) can improve the quality of the sampled data, with a tradeoff in that denser data generally increases the time and/or cost of acquiring the data (due to the larger number of samples).

TABLE 1

| Mesh size | Mean | Variance | Skewness |
|---|---|---|---|
| 24 × 24 | 194.4 | 5.54 | −1.503 |
| 48 × 48 | 194.4 | 4.53 | −0.899 |
| 96 × 96 | 194.3 | 4.48 | −0.760 |

Figure 4:
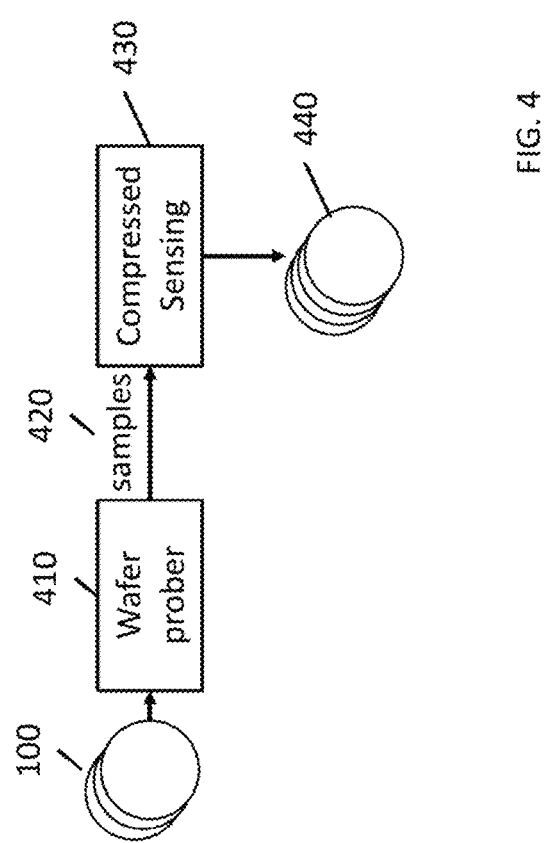
FIG. 4 is a flowchart illustrating a method for generating full wafer maps from samples taken of testing wafer sets according to one embodiment of the present invention.

FIG. 4 is a flowchart illustrating a method for generating full wafer maps from samples taken of testing wafer sets according to one embodiment of the present invention. As shown in FIG. 4, wafers to be analyzed (e.g., wafers retrieved from some step of the semiconductor manufacturing process or after completion of the semiconductor manufacturing process) are supplied to a wafer prober 410, which tests only a subset of all of the dies of the wafers 100, where the particular dies that are tested are selected based on a probing mask. In some embodiments of the present invention, the probing mask is a random selected set of locations on the wafer. In some embodiments, the same probing mask is used for all of the wafers in a run of wafers. The wafer prober 410 outputs spatially sparse test data (e.g., test data for each of the locations identified by the probing mask), referred to as "samples" 420, to a compressed sensing module 430 of a full wafer reconstruction module, which generates reconstructed wafer maps 440 using compressed sensing techniques based on Zernike polynomials, as described above. In some embodiments of the present invention, the probing mask identifies 5% to 10% of all of the dies of the wafer.

Figure 5A:
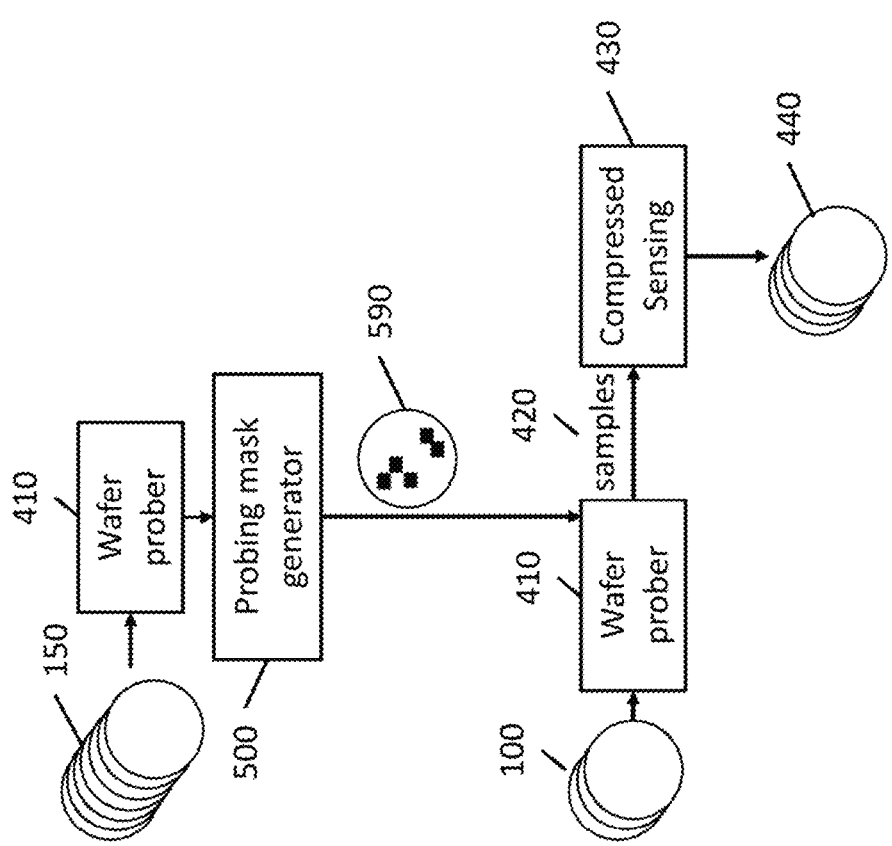
FIG. 5A is a flowchart illustrating a method for generating full wafer maps from samples taken of testing wafer sets using customized or optimized probing masks according to one embodiment of the present invention.

FIG. 5A is a flowchart illustrating a method for generating full wafer maps from samples taken of testing wafer sets using customized or optimized probing masks according to one embodiment of the present invention. The method shown in FIG. 5A is substantially similar to that of FIG. 4, except that a customized or optimized probing mask 590 is used by the wafer prober 410. In some embodiments of the present invention, the customized or optimized probing mask 590 is automatically computed by a probing mask generator 500 from a training set of wafers 150.

Figure 5B:
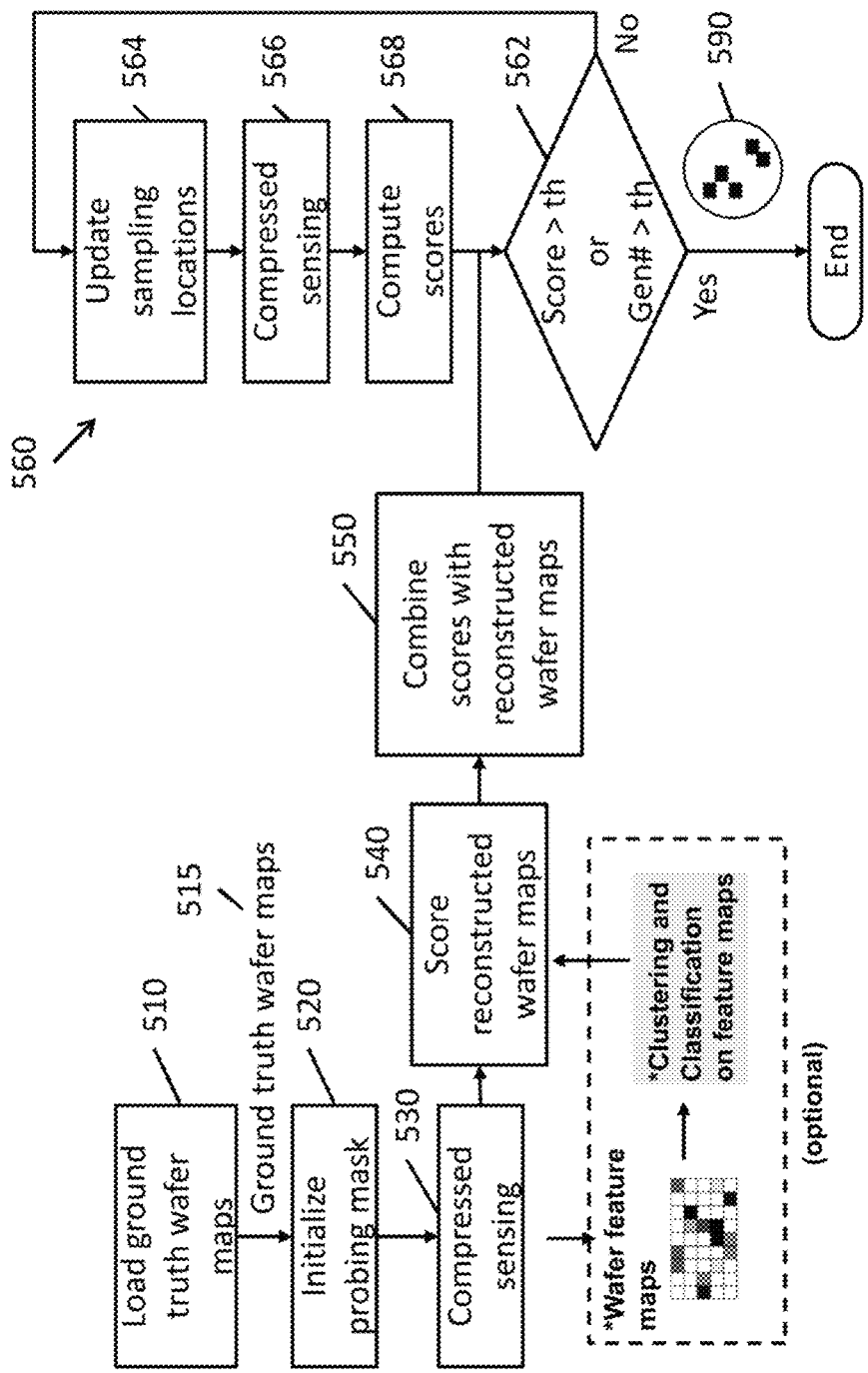
FIG. 5B is a flowchart illustrating a method according to one embodiment of the present invention for computing a customized or optimized probing mask for a run of wafers based on a set of training wafers.

Some aspects of embodiments of the present invention relate to improving the quality of the samples by automatically determining sampling (or probing) locations on a wafer under measurement for a run of wafers (a wafer set). FIG. 5B is a flowchart illustrating a method according to one embodiment of the present invention for computing a customized or optimized probing mask for a run of wafers based on a set of training wafers.

As shown in FIG. 5B, in operation 510, the probing mask generator 500 receives a set of ground truth wafer maps of a set of training wafers 150 from the full wafer set 100. To generate the full wafer maps, each die of each of the wafers is fully tested to generate full ("ground truth") wafer maps for each of the wafers of the training set. The set of training wafers may be selected to be representative of the full set of wafers (e.g., a randomly selected subset of the full set of wafers). In operation 520, a probing mask is initialized to, for example, a randomly selected set of locations (as discussed above, in some embodiments of the present invention, the locations may correspond to 5% to 10% of all of the dies on the wafer, where the particular number of or percentage of samples depends on the specific characteristic to be tested), and, in operation 530, compressed sensing is performed to generate compressed sensing-generated wafer maps from the samples (e.g., using convex optimization or LASSO). In operation 540, these CS-generated wafer maps are evaluated ("scored") by summing over their $L_1$ and $L_2$ norms when comparing the CS-generated wafer maps to the ground truth wafer maps. The scores are combined with the CS-generated wafer maps in operation 550 to generate initial data for a genetic algorithm (GA) to identify a set of sample locations for the set of wafers (e.g., an optimal set of sampling locations).

In one embodiment, the genetic algorithm 560 iteratively generates new generations of sampling locations based on the scores of the previous sampling locations. In more detail, in operation 562, the computed score is compared against a score threshold. If the score threshold is satisfied (e.g., the error is sufficiently low or the percentage of agreement between the reconstruction and the ground truth is sufficiently high), then the genetic algorithm ends and the current probing mask 590 is output. If the score threshold is not satisfied, then a generation counter is incremented and the process continues by updating the sampling locations in accordance with a genetic algorithm (e.g., generating multiple potential masks based on perturbing some of the locations of the current mask to generate a new set of masks). The data values at the sampling locations of the new generation of masks are used to perform compressed sensing in operation 566 to generate new wafer maps, which are scored against the ground truth wafer maps in operation 568. The scores of the new generation of masks are compared against various criteria for quality and, if conditions are not satisfied, then the process returns to operation 564 to generate another generation of sampling locations based on the previous generation. The process continues until the evaluation criteria are met or until a maximum number of generations is reached, at which point the sample locations of the final generation are output as a probing mask (or "optimized" probing mask) 590.

Equation 1 below, expresses the least-squares minimization function for minimizing the errors (the $L_1$ and $L_2$ norms) over the training set $x_B$ and a cross-validation set $y_B$. This technique corresponds to an application of LASSO to this domain.

$$\min_{(x_B, y_B)} \min_G \|ZG - B\|_{L2}^2 + \lambda_0 \|G\|_{L1}$$

The cross-validation set $y_B$ is used to verify that the selected sampling locations are reasonable and give good results and to ensure the major variability sources among the wafers are identical or similar. In particular, when samples are relatively redundant (e.g. >10% of the minimum requirement), the samples can be divided into sub-groups, where one of the sub-groups can be used to train the model each time, while the other sub-groups are used to test the accuracy of the trained model. In some embodiments, this test-verify is repeated for several loops to select an optimal model. The optimized model can be used to predict wafer maps from the same lot.

According to some embodiments of the present invention, this customized or optimized probing mask 590 may be used for a set of wafers that are expected to have substantially similar characteristics (e.g., wafers cut from a same cylindrical ingot and run on the same fabrication line). Accordingly, in some embodiments of the present invention, a new probing mask is computed for each wafer set (e.g., for each run of wafers).

Figure 5C:
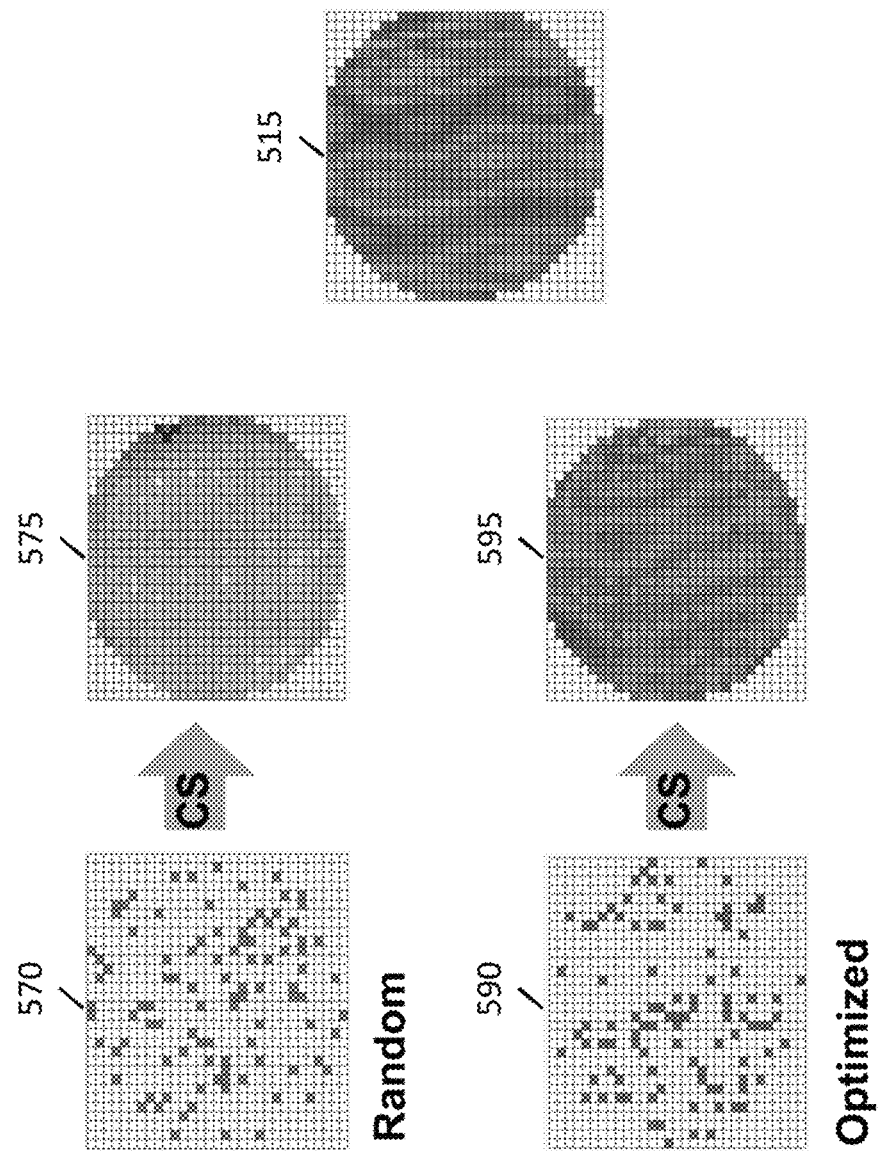
FIG. 5C compares a ground truth wafer map of a wafer with a wafer reconstruction based on a random sampling of the wafer and a wafer reconstruction based on a sampling of the wafer guided by a customized or optimized probing mask according to one embodiment of the present invention.

FIG. 5C compares a ground truth wafer map 515 of a wafer with a wafer reconstruction 575 based on a random sampling 570 of 10% of the wafer and a wafer reconstruction 595 based on a sampling of 10% of the wafer guided by a customized or optimized probing mask 590 according to one embodiment of the present invention. As seen in FIG. 5C, the wafer reconstruction based 595 on the customized or optimized probing mask 590 is qualitatively much more similar in appearance to the ground truth wafer map 515 than the wafer reconstruction 575 based on random sampling 570.

FIG. 5D includes graphs comparing ground truth wafer maps with wafer reconstructions based on a random sampling of the wafers and wafer reconstructions based on sampling of the wafers guided by a customized or optimized probing mask according to one embodiment of the present invention. FIG. 5D-1 shows the decrease in error between a wafer reconstruction using a customized or optimized probe mask 590 and ground truth wafer masks from a first generation to one hundredth generation of a customized or optimized probe mask as generated in accordance with a technique, such as the technique shown in FIG. 5B, for generating a customized or optimized probe mask according to one embodiment of the present invention. As shown in FIG. 5D-1, the error decreases as the technique shown in FIG. 5B generates probing masks that select more relevant samples (e.g., samples conveying more information about the overall wafer map), where the training was performed using 32 CPU'threads and a turn-around time of 1,380 seconds (e.g., the elapsed time to compute the 100 generations of probing masks). FIGS. 5D-2, 5D-3, and 5D-4 are graphs that depict the quantitative improvement in the statistical characteristics of the wafer reconstructions as compared with a random probe mask 560. As shown in FIGS. 5D-2 and 5D-3, respectively, the mean variance and the variance difference between the customized or optimized probe mask 590 and the ground truth wafer maps 515 and are smaller than the respective differences between the wafer reconstructions based on the ground truth wafer maps and the wafer reconstructions based on samples taken using the random probe mask 560. Furthermore, as shown in FIG. 5D-4, the skewness values computed from the wafer reconstructions based on the customized or optimized probe mask are closer to the skewness of the ground truth wafer maps than then skewness of the wafer maps reconstructed based on samples taken using the random probe mask. As such, FIG. 5D illustrates an improvement the compressed sensing wafer reconstructions when using a customized or optimized probe mask.

Figure 6:
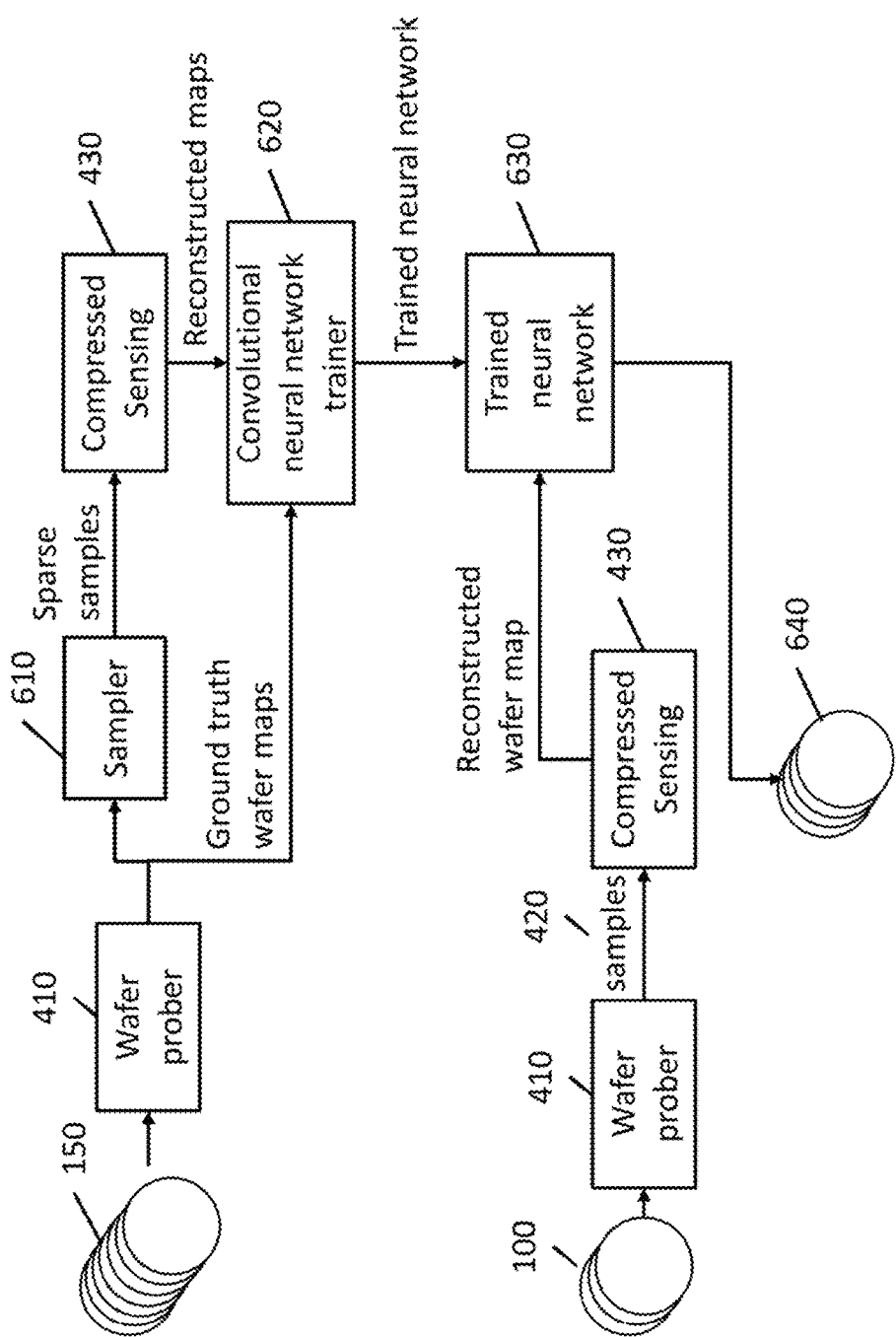
FIG. 6 is a flowchart illustrating a method for generating reconstructed wafer maps from samples taken of testing wafer sets and further improved using a trained convolutional neural network according to one embodiment of the present invention.

FIG. 6 is a flowchart illustrating a method for generating reconstructed wafer maps from samples taken of testing wafer sets and further improved using a trained convolutional neural network according to one embodiment of the present invention. As shown in FIG. 6, in some embodiments of the present invention, a convolutional neural network (e.g., a deep convolutional neural network) is trained by the full wafer reconstruction module to improve the quality of the reconstructed wafer maps. In more detail, a training wafer set 150 (e.g., a representative sample from the full wafer set) is fully analyzed by a wafer prober 410 to generate a plurality of ground truth wafer maps. In addition, samples are taken from various locations in the ground truth wafer maps (e.g., using a random probe mask or using a customized probe mask, as described above with respect to FIGS. 5A, 5B, 5C and 5D) by a sampler 610, and compressed sensing 430 is applied to the samples to generate reconstructed wafer maps. The reconstructed wafer maps and the ground truth maps are supplied as training data for training 620 a convolutional neural network to compute the ground truth wafer map from the reconstructed wafer maps. The training of the convolutional neural network may proceed using, for example, backpropagation. In some instances, a test set of wafers is used to verify that the training process has generated a useful model (e.g., to detect overfitting of the model).

The trained models or trained convolutional neural network can then be used by the full wafer reconstruction module to perform inferences 630. In other words, the trained neural network is used on the remaining wafers in the full wafer set to generate more accurate reconstructed wafer maps from the wafer maps reconstructed from compressed sensing alone. In operation 430, compressed sensing is applied to generate compressed sensing reconstructed wafer maps from sparse samples 420 taken from various dies of the wafers. In operation 630, the compressed sensing reconstructed maps are supplied as input to the trained model (e.g., trained convolutional neural network) to generate (updated) reconstructed wafer maps 640.

As such, some embodiments of the present invention relate to using a deep convolutional neural network to improve the output of a compressed sensing reconstructed wafer map (e.g., to generate a reconstructed wafer map that is closer to the ground truth wafer map).

Figure 7:
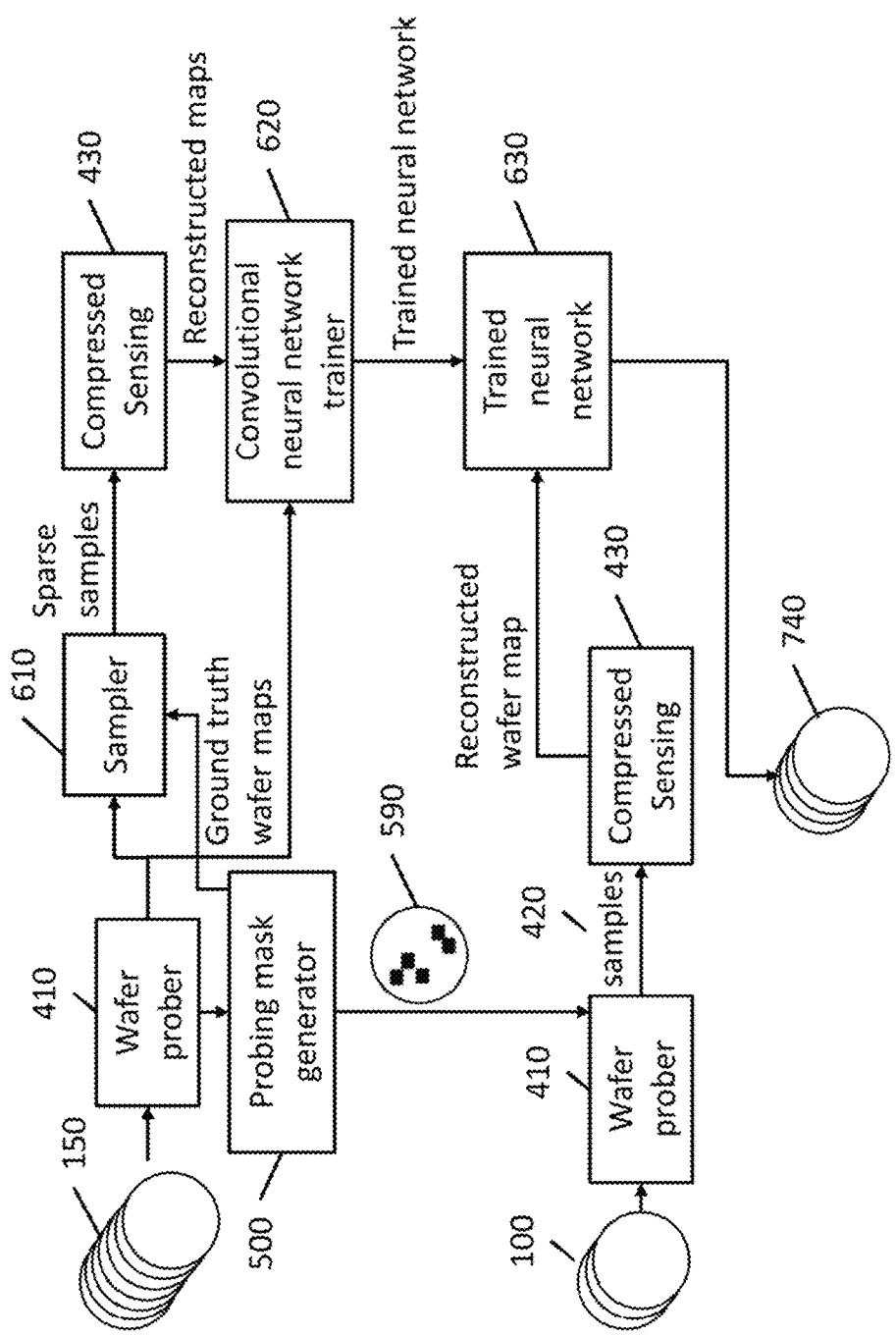
FIG. 7 is a flowchart illustrating methods for generating reconstructed wafer maps from samples taken of testing wafer sets using customized or optimized probing masks and further improved using a trained convolutional neural network according to one embodiment of the present invention.

FIG. 7 is a flowchart illustrating methods for generating reconstructed wafer maps from samples taken of testing wafer sets using customized or optimized probing masks and further improved using a trained convolutional neural network according to one embodiment of the present invention. As seen in FIG. 7, in some embodiments of the present invention, the techniques described above with respect to FIGS. 5A. 5B, 5C, 5D, and 6 are combined. In more detail, a customized or optimized probing mask 590 may be computed in a manner similar to that described with respect to FIGS. 5A. 5B, 5C, and 5D. The resulting customized or optimized probing mask 590 may then be used to generate the input training data for training 620 the convolutional neural network. The same customized or optimized probing mask is also used to select sparse samples from the full wafer set, and the compressed sensing reconstructed wafer maps are supplied to the trained convolutional neural network to generate output reconstructed wafer maps 740.

As such, aspects of embodiments of the present invention relate to systems and methods for generating reconstructed wafer maps of full wafers based on sparse samples from the wafers, thereby reducing the turn-around time for generating full wafer maps, and thereby shortening feedback loops or control loops for controlling a semiconductor fabrication process. This, in turn, reduces waste and increases yields, because problems such as process drift are detected more quickly than in a conventional system.

Some aspects of embodiments of the present invention also relate to generating "footprints" or "signatures" of the wafers, where these footprints or signatures may be used to classify the wafers for later processing, such as detecting "bad" wafers, "good" wafers, or wafers exhibiting anomalous characteristics (e.g., missing a layer due to a failed step in a semiconductor manufacturing process). In particular, these footprints or signatures may be computed using trained feature extractors, and the features computed by the feature extractors may be supplied to trained classifiers to classify the wafers.

Figure 8:
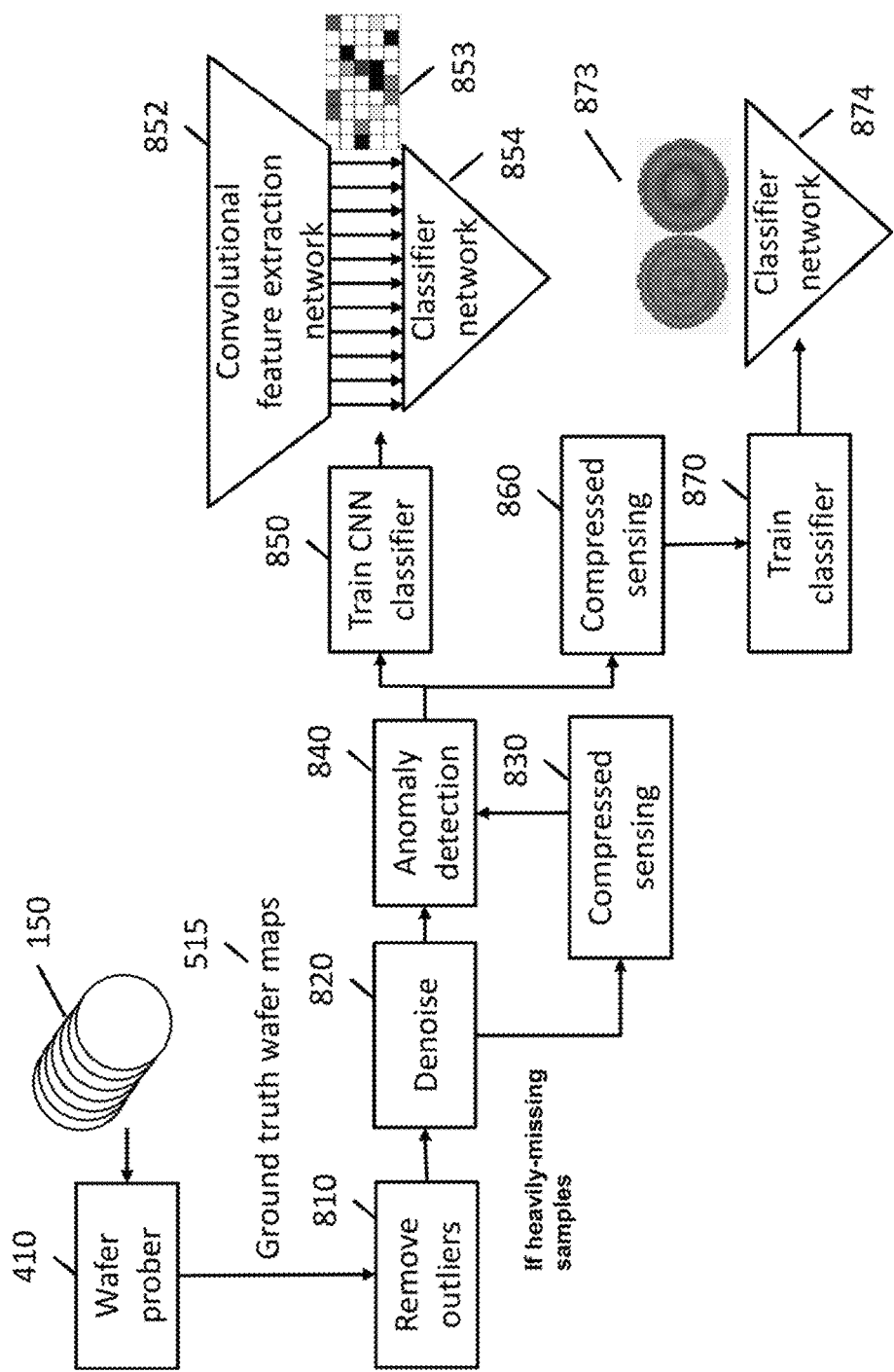
FIG. 8 is a flowchart depicting a method according to one embodiment of the present invention for training feature detectors for generating footprints or signatures of wafers.

FIG. 8 is a flowchart depicting a method according to one embodiment of the present invention for training feature detectors for generating footprints or signatures of wafers using a classifier training module of a virtual metrology system according to embodiments of the present invention. In some embodiments of the present invention, the feature detectors are unsupervised learning models, such as a convolutional auto-encoders (CAE) configured to take wafer maps as input and compute wafer maps as output. As shown in FIG. 8, a training wafer set 150 is used for training the feature detectors and classifiers, where a wafer prober 410 tests all of the dies of the training wafer set 150 to generate ground truth wafer maps 515, where the ground truth wafer maps 515 include test data for every die of every wafer of the training wafer set 150. In operations 810 and 820, initial pre-processing of the wafer maps is performed. In particular, in operation 810, outlier wafers are removed (e.g., based on the values of the data in the wafers and patterns in the data, such as by removing the maximum and minimum values or using Z-scores of the wafers), and in operation 820, a denoising filter is applied (e.g., blurring the data using a Gaussian kernel). In some embodiments of the present invention, if the input wafer map is sparse (e.g., one or more of the ground truth wafer maps 515 is missing many samples), then compressed sensing using an orthogonal basis (e.g., Zernike polynomials) is applied in operation 830 to the pre-processed data to generate a full wafer map. An anomalous wafer detection module then generates labels for the pre-processed full wafer maps using, for example, principal component analysis (PCA) or biclustering approaches to automatically label the wafers with one of a number of different labels (e.g., an "anomalous" label and a "non-anomalous" label).

Figure 9:
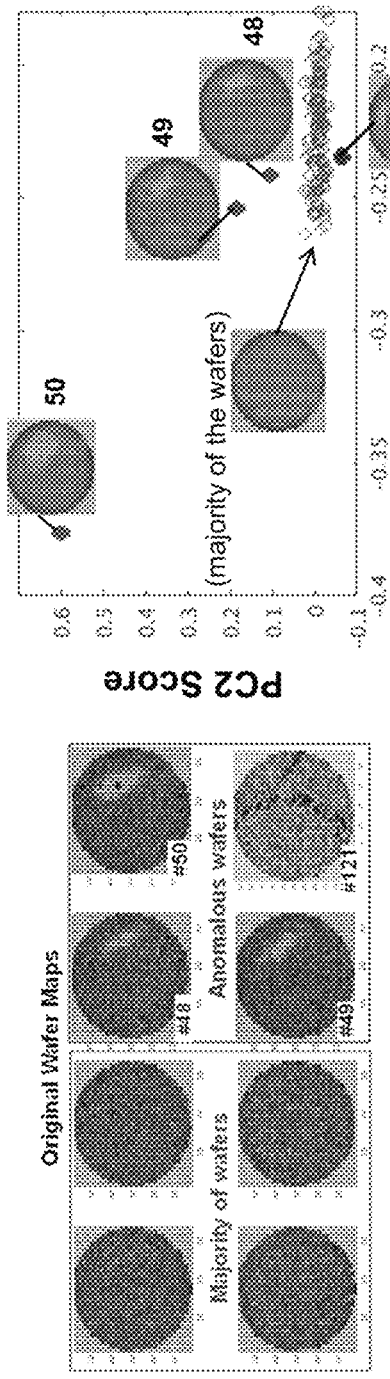
FIG. 9 depicts examples of anomaly detection according to one embodiment of the present invention.
Figure 9:
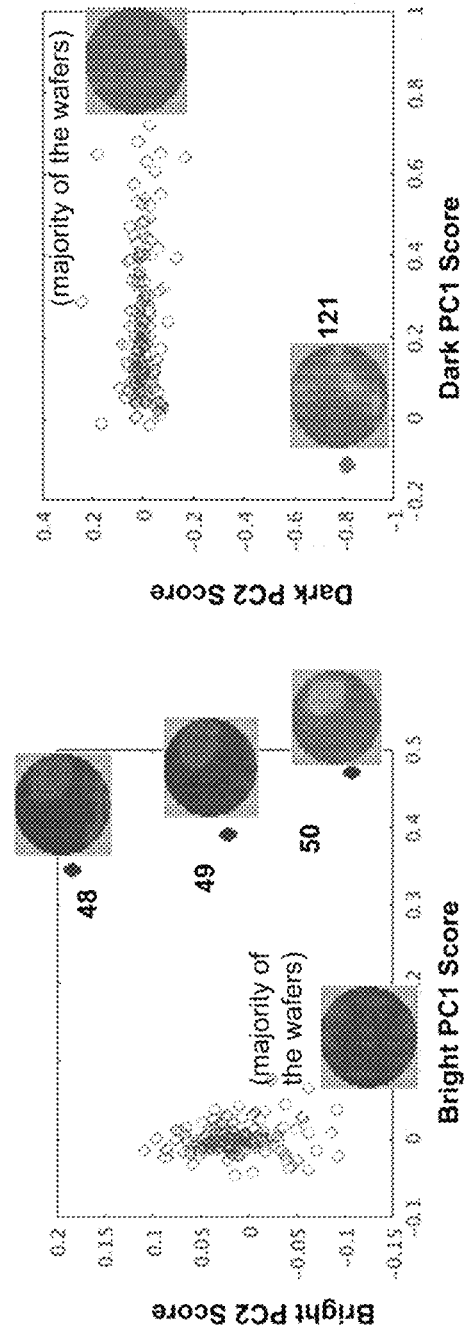

FIG. 9 depicts examples of anomaly detection according to one embodiment of the present invention. FIG. 9A depicts a few sample pre-processed (e.g., denoised) wafer maps.

The four wafer maps shown on the left side of FIG. 9A are reflect the sorts of wafer maps found in the majority of the wafers, while the four anomalous wafers shown on the right side of FIG. 9A depict various types of defective wafers (FIG. 9A shows, in particular, wafers #48, #49, #50, and #121 out of a particular experimental set of 150 wafers.

The qualitative differences between the majority of the wafers and the anomalous wafers that are apparent in FIG. 9A can be quantified through principal component analysis (PCA). In the example shown in FIG. 9B, applying PCA has identified two principal components, labeled PC1 and PC2, where the majority of the wafers are clustered around PC1 scores in the range of about −0.26 to about −0.17 and PC2 scores from about −0.05 to about +0.05. In contrast, the four anomalous wafers shown in FIG. 9A are separated from the majority of the wafers. For example, wafer #48 has a PC1, PC2 score of approximately (−0.25, 0.1), wafer #49 is at approximately (0.255, 0.19), wafer #50 is at approximately (−0.38, 0.6) and wafer #121 is at approximately (−0.24, −0.8).

While FIG. 9A shows some separation between the anomalous wafers and the majority of the wafers, some of the wafers, such as wafers #48, #49, and #121 are somewhat close to the majority of the wafers. Accordingly, further using thresholding-blurred data can reveal further separation between the anomalous wafers and the majority of the wafers. For example, FIG. 9C shows "bright PC1" and "bright PC2" scores based on applying thresholds to the data (e.g., replacing pixels darker than a particular threshold level with a black pixel, and adjusting the values of all pixels brighter than the threshold value to the dynamic range of the data format). In FIG. 9C, wafers #48, #49, and #50 are further separated from the majority of the wafers, thereby improving the confidence with which they are determined to be outliers. Similarly, FIG. 9D shows "dark PC1" and "dark PC2" scores based on applying threshold to the data (e.g., replacing pixels brighter than a threshold value with white and adjusting the values of all pixels darker than the threshold value to the dynamic range of the data format). In FIG. 9D, wafer #121 is further separated from the majority of the wafers, thereby improving the confidence with which it can be determined to be an outlier.

Accordingly, some aspects of embodiments of the present invention relate to applying principal component analysis to sets of pre-processed full wafer maps to automatically generate labels for further training a convolutional neural network for automatically classifying wafers.

Returning to FIG. 8, in operation 850, a convolutional neural network is trained by the classifier training module based on the pre-processed data sets and the labels generated by the anomalous wafer detection module, where the output of the convolutional layer (or layers) corresponds to high level features that are supplied to a classifier network to assign the particular labels. The convolutional neural network may be, for example, a deep convolutional neural network such as a convolutional auto-encoder. In some embodiments, one or more of the layers of the convolutional neural network implement filters such as a Gabor filter. In addition, compressed sensing may be performed on the pre-processed full wafer maps in operation 860 to generate additional features (e.g., the coefficients of the Zernike polynomials).

In some embodiments of the present invention, two separate classifiers 854 and 874 are trained—one which takes the feature map from the convolutional neural network as input, and one which takes the compressed sensing reconstructed wafer map (e.g., the coefficients of the Zernike polynomials) as input. In some embodiments of the present invention, a single classifier is trained that takes a CNN feature map and the coefficients of the Zernike polynomials from the compressed sensing analysis as inputs. The values computed by the trained convolutional portion 852 of the neural network and/or the compressed sensing 860 will be referred to herein as the "footprint" or "signature" of a wafer (or its "feature map") 853 and 873, where supplying the feature map to the classifier network will generate a classification of the input wafer based on its feature map (e.g., a classification as to whether or not the wafer is anomalous).

Figure 10A:
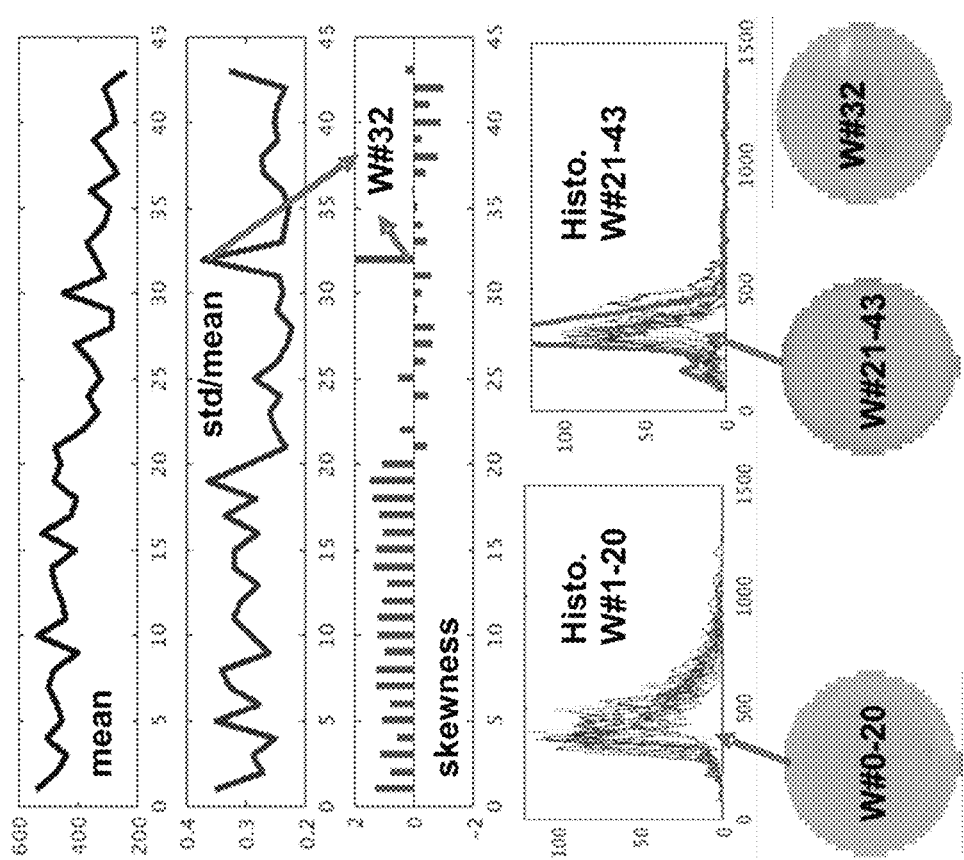
FIG. 10A depicts examples of the statistical analysis of reconstructed wafer maps according to one embodiment of the present invention.
Figure 10B:
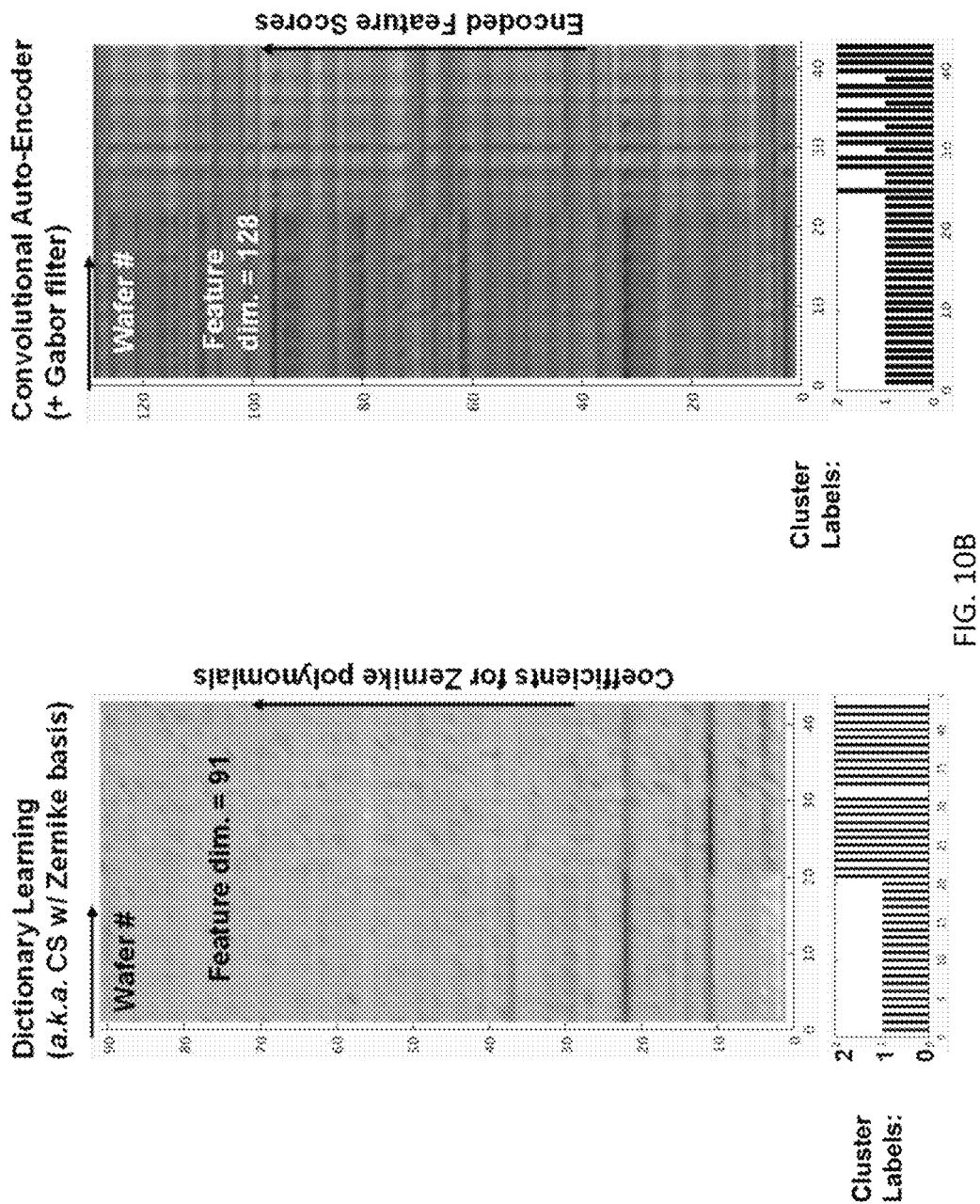
FIG. 10B depicts examples of the analysis of wafer map footprints extracted in accordance with the system described in FIG. 8 according to one embodiment of the present invention.

FIGS. 10A and 10B present examples of a set of 43 wafers in which the first 20 wafers of the set are anomalous, and the remaining 23 wafers, apart from wafer #32, have better (e.g., more typical) spatial uniformity.

FIG. 10A depicts examples of the statistical analysis of the ground truth data from the set of 43 example wafers. The graphs in FIG. 10A depict statistical analysis of the dies of the wafers, including calculating the mean values of the wafers, the standard deviation of the mean, and the skewness of the wafers. As shown in FIG. 10A, the standard deviation and skewness values are smaller for wafers #21 through #43 (except for wafer #32), which corresponds to the known characteristic of this example set that wafers 1 through 20 and 32 are anomalous (e.g., defective). In addition, FIG. 10A depicts histograms of values for each of the wafers, where wafers #1 through #20 show a wider distribution of values than wafers #21 through #43.

As such, reconstructed wafer maps that are reconstructed through compressed sensing in accordance with embodiments of the present invention provide data for accurately analyzing the statistical properties of wafer maps, without requiring the testing of every die on the wafer.

FIG. 10B depicts examples of the analysis of wafer map footprints extracted in accordance with the system described in FIG. 8 according to one embodiment of the present invention. In the circumstances shown in FIG. 10B, compressed sensing (supervised learning) achieves better clustering results based on the extracted features (e.g., the coefficients of the Zernike polynomials) than the convolutional auto-encoder (unsupervised learning) features. This is shown by the auto-encoder's labeling of wafers 21-24, 26, 27, 30, 33, 36, and 39 as being anomalous (value of 1, as shown in FIG. 10B) and failing to label wafer #32 as being anomalous (instead, labeling it with the value 2, as shown in FIG. 10B), whereas the compressed sensing features correctly label wafers 21-31 and wafers 33-43 as being non-anomalous (values of 2), and labeling wafers 1-20 and 32 as being anomalous (with values of 1 or 0).

As such, aspects of embodiments of the present invention are directed to labeling wafers, automatically, as being anomalous or non-anomalous (e.g., normal), based on feature maps or footprints generated from full wafer maps reconstructed from sparse samples of the dies of a wafer. Accordingly, embodiments of the present invention allow for monitoring the quality of the integrated circuits on wafers produced by a semiconductor manufacturing process with a shorter turn-around time than performing a full test of every die on the wafer. The shorter turn-around time allows process drift to be detected more quickly, allowing the semiconductor manufacturing equipment to be adjusted to compensate for that process drift sooner, thereby reducing the magnitude of process drift. In other words, aspects of embodiments of the present invention enable shorter control loops (e.g., faster feedback), thereby improving overall yields, at least because detecting and correcting problems sooner results in the manufacture of fewer defective wafers.

Various aspects of embodiments of the present invention, including the fault detection, metrology, virtual metrology (e.g., the full wafer reconstruction module, the probing mask generator, the classifier training module, and the classification module), and run-to-run control of the system may be implemented in one or more computer systems or controllers. For example, the computation of reconstructed wafer maps from sparse samples of the dies of the wafers, the computation of customized or optimized probing masks, the training of and inference (forward propagation use of) the convolutional neural networks for improving the reconstructed wafer maps, the training of and inference from classifiers based on compressed sensing inputs and convolutional neural networks, may all be performed using one or more computer systems or controllers. One or more computing devices may be used together (e.g., distributing the computation across multiple computers connected over a network and/or multiple processors of a single computer). For the sake of convenience, the term "computer system" will be used to refer to one or more computing devices or computers that are configured to perform the various operations described herein.

Figure 11:
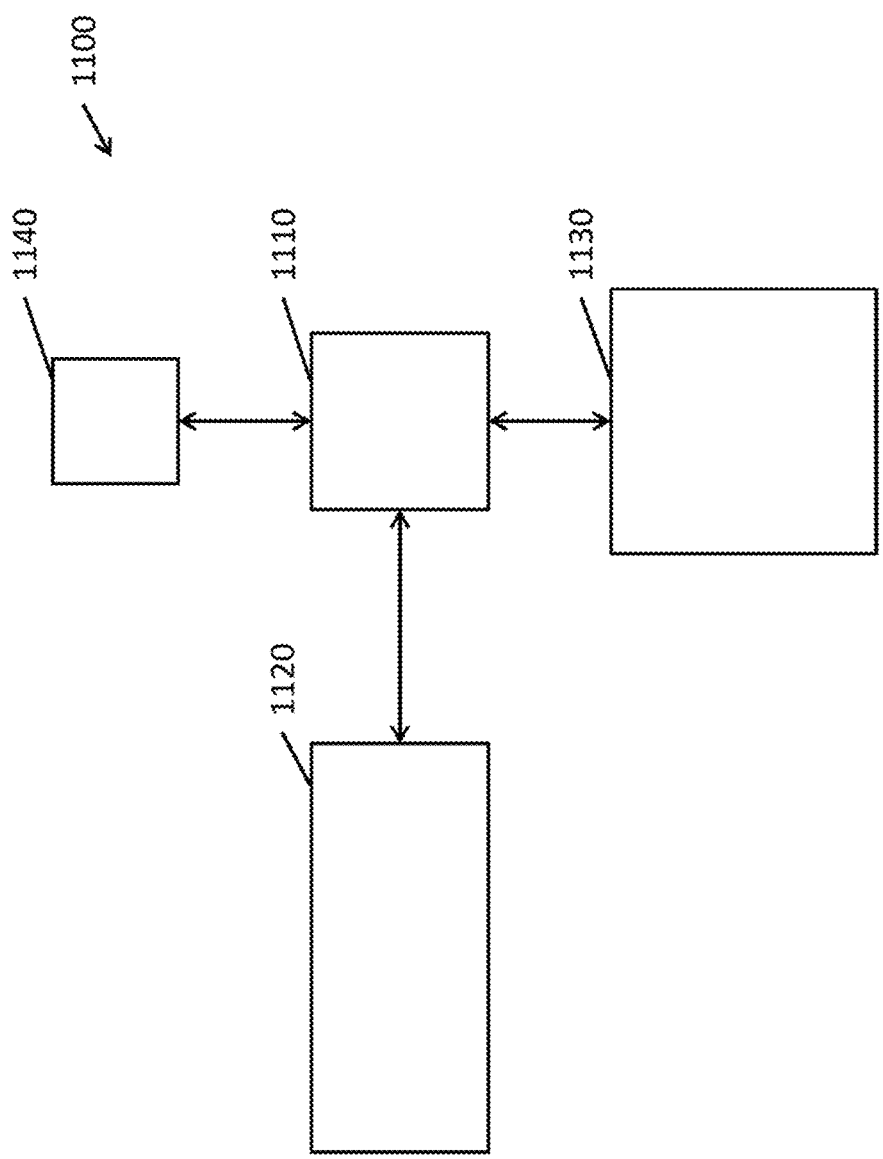
FIG. 11 is a block diagram of a computer system configured to implement aspects of embodiments of the present invention.

FIG. 11 is a block diagram of a computer system configured to implement aspects of embodiments of the present invention. As shown in FIG. 11, a computer system 1100 may include a processor 1110 and memory 1120 storing instructions that configure or cause the processor to perform a particular method. The instructions stored in the memory cause the processor to perform special purpose tasks. In some circumstances, one or more special purpose processors 1130 may be used in conjunction with the processor 1110. Examples of special purpose processors include graphical processing units (GPUs) or other vector processors (which are suited for particular computational tasks including training neural networks). Other examples of special purpose processors include field programmable gate arrays (FPGAs), and application specific integrated circuits (ASICs), which may be configured to perform particular operations specific to an environment. For example, after a neural network is trained, the configuration parameters (e.g., weights of the connections within the neural network) can be used to configure an FPGA to implement the neural network, and the configured FPGA can be used to perform the inference function of classifying input data based on the received samples. The FPGA may also include portions that are configured to perform various pre-processing operations (e.g., outlier removal and denoising) on the input wafer maps. A computer system may further include one or more input/output controllers 1140 such as network adapters (e.g., for communicating with other computers over a network), display adapters (e.g., for outputting information to a display panel), peripheral adapters (e.g., universal serial bus or USB adapters for connecting to, for example, user input devices), and the like.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method for reconstructing wafer maps of semiconductor wafers comprising a plurality of dies, comprising:
receiving, by a processor, test data of characteristics of dies at sparse sampling locations of a semiconductor wafer, the sparse sampling locations being selected based on a probing mask; and
computing, by the processor, a reconstructed wafer map comprising reconstructed characteristics of all of the dies of the semiconductor wafer by performing compressed sensing with Zernike polynomials on the test data of the dies at the sparse locations of the semiconductor wafer.

2. The method of claim 1, wherein the sparse sampling locations of the probing mask are randomly selected.

3. The method of claim 1, wherein the sparse sampling locations of the probing mask are generated by:
receiving a training set of ground truth wafer maps;
setting a probing mask based on an initial set of sparse sampling locations;
selecting samples from the training set of ground truth wafer maps based on the probing mask;
applying a genetic algorithm to compute a customized probing mask, the genetic algorithm iteratively, over a plurality of generations:
computing reconstructed wafer maps using compressed sensing based on the test data taken from the sparse sampling locations;
scoring the reconstructed wafer maps against the training set of ground truth wafer maps;
updating the sparse sampling locations of the probing mask in accordance with the scores; and
returning the updated sparse sampling locations of the probing mask from the genetic algorithm when a threshold error rate is satisfied or when the plurality of generations reaches a generation limit.

4. The method of claim 1, further comprising supplying the reconstructed wafer map reconstructed by compressed sensing to a first convolutional neural network, the first convolutional neural network being configured to update the reconstructed wafer map.

5. The method of claim 4, wherein the first convolutional neural network is trained by:
receiving a training set of ground truth wafer maps;
selecting samples from the training set of ground truth wafer maps based on the probing mask;
computing training reconstructed wafer maps from the selected samples from the training set of ground truth wafer maps; and
applying backpropagation to train the first convolutional neural network to compute the training set of ground truth wafer maps from the training reconstructed wafer maps.

6. The method of claim 1, further comprising classifying the reconstructed wafer map with one of a plurality of labels using a classifier,
wherein the classifier is trained using:
a training set of ground truth wafer maps; and
a plurality of labels of the training set of ground truth wafer maps, the plurality of labels being computed by applying an anomaly detection technique to the training set of ground truth wafer maps to identify one or more classes of wafers, the classes of wafers comprising anomalous wafers and non-anomalous wafers.

7. The method of claim 6, wherein the anomaly detection technique includes at least one of principal component analysis or biclustering.

8. The method of claim 6, further comprising supplying a plurality of Zernike polynomial coefficients corresponding to the reconstructed wafer map to the classifier, wherein the classifier is trained by:
    selecting samples from the training set of ground truth wafer maps based on the probing mask;
    computing training reconstructed wafer maps from the selected samples from the training set of ground truth wafer maps; and
    training the classifier to predict the plurality of labels based on a plurality of training Zernike polynomial coefficients from the training reconstructed wafer maps.

9. The method of claim 6, further comprising:
supplying the reconstructed wafer map to a feature extractor to compute a feature map; and
supplying the feature map to a second trained classifier to classify the reconstructed wafer map with one of the plurality of labels,
wherein the feature extractor is a second convolutional neural network, the second convolutional neural network being trained by training the classifier to predict the plurality of labels based on the training set of ground truth wafer maps.

10. The method of claim 1, further comprising controlling a run-to-run controller of a semiconductor fabrication process based on the reconstructed wafer map.

\* \* \* \* \*